June 8, 1965 W. H. MEIKLEJOHN 3,188,579
CRYOGENIC OSCILLATOR
Filed July 30, 1962 2 Sheets-Sheet 1
Fig. 1.
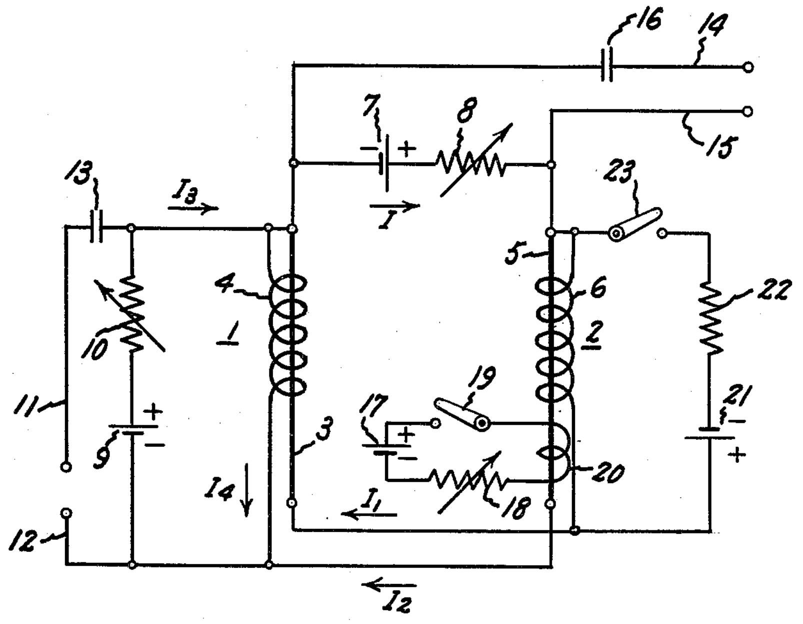
Fig. 2. Fig. 3.
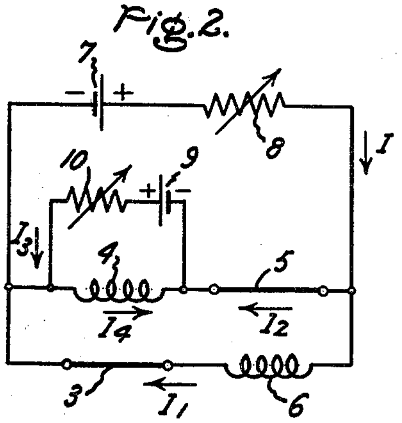
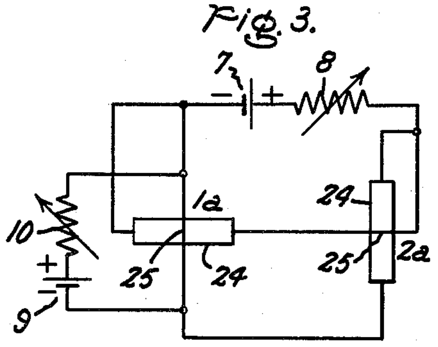
Inventor:
William H. Meiklejohn,
by John P. Dellitt
His Attorney.

CRYOGENIC OSCILLATOR

Filed July 30, 1962 2 Sheets-Sheet 2

Inventor:
William H. Meiklejohn,
by John P. Dellitt
His Attorney.

3,188,579

CRYOGENIC OSCILLATOR

William H. Meiklejohn, Scotia, N.Y., assignor to General Electric Company, a corporation of New York Filed July 30, 1962, Ser. No. 213,456
5 Claims. (Cl. 331—107)

Figure 4:
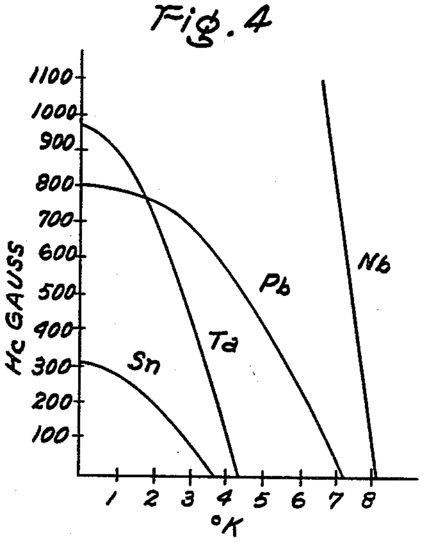

This invention relates to a cryogenic relaxation oscillator and more particularly to a compact cryogenic oscillator wherein the magnetic field of a control conductor is effective to alternate a superconductor between superconducting and resistive states.

Superconductivity is that property exhibited by certain metals of losing substantially all electrical resistance at low temperatures near absolute zero. Among such metals are niobium, lead, tantalum, tin, vanadium and mercury. A number of alloys and compounds also exhibit superconductive properties. As a conductor formed of one of these materials is lowered in temperature, the resistance drops more or less uniformly until a temperature is reached at which resistance suddenly disappears. This temperature is a property of the particular material and is called the critical temperature for the material. Below this temperature resistance may be restored by subjecting the conductor to a magnetic field in excess of a given value called the material's critical field. In addition resistance may also be restored at temperatures below the critical temperature by means of passing a current through the conductor in excess of a designated critical current. The critical current re-establishes resistance in large part because of the magnetic field associated with the current.

Practical superconducting devices have been developed which enable operation of entire circuits at extremely low or superconducting temperatures, conventionally near the boiling temperature of liquid helium (4.2° Kelvin). Such circuitry is largely lossless, containing a majority of zero resistance components and interconnections; therefore the superconducting circuits and elements may be greatly miniaturized with many thousands accommodated per cubic foot. Thus far, most common superconducting circuits involve simple cryogenic switching elements. In these elements, called cryotrons, a current in a superconductor called a gate is effectively turned on and off by means of a closely proximate magnetic field. The magnetic field is generated with another superconductor called a grid-control or simply a grid. These switching elements, or cryotrons, are assembled into a computing arrangement whereby a whole computer may be accommodated in small volume.

A further advantage accrues in providing more complex circuitry at the superconducting level in order to more fully achieve circuit completeness and compactness, as well as to prevent a multiplicity of interconnections between the superconducting circuit and non-superconducting circuitry. The present invention relates to an improved superconducting relaxation oscillator and logic unit operable at superconducting temperatures and which advantageously employs superconductive phenomena. The device generates wave forms in a superconducting environment for use as clock pulses and timing pulses within a superconducting computer or the like.

Superconducting relaxation oscillators as heretofore contemplated have included two general types. A first may be described as a thermal oscillator wherein a particular superconductor repetitively exceeds its critical temperature and is then allowed to cool to its superconducting range. The periodicity of this oscillator is gauged by the superconductor's thermal time constant, or the time taken for cooling to a superconducting temperature. This type of oscillator is not well suited to high frequency oscillations because of the time consumed in the heat cycle. In addition the frequency of oscillation is to a great extent influenced by the heating and heat dissipating properties of the oscillator's environment making the oscillation frequency somewhat unpredictable.

A second type of relaxation oscillator comprises a plurality of separate bistable circuits or flip-flops. Each bistable stage includes a pair of cryotron switching devices with cross-coupling therebetween wherein only one cryotron gate of the pair is superconducting at any one time. An odd number of such stages, greater than one, are cascaded in a ring with the output of the last stage triggering the first. In this manner, a particular stage operates to change the state of the next, and at least one buffer stage completes the circular connection. This arrangement of course rquires a comparatively large number of components as compared with a one-stage vacuum tube multivibrator for example. Moreover, the oscillations produced are somewhat non-symmetrical and the frequency capability is inherently scaled down by a factor of at least three, inasmuch as at least three stages are required.

It is accordingly an object of the present invention to provide a cryogenic or superconducting relaxation oscillator capable of generating higher frequency wave forms with a minimum of component circuitry.

It is another object of this invention to provide an improved one-stage cryogenic relaxation oscillator whose frequency may be electrically determined substantially independently of its physical environment.

A single conventional one-stage bistable superconducting circuit as descrived above, including two cross-coupled cryotrons, is not capable of sustained oscillation. Such a circuit, sometimes called a cross-latching circuit, may be placed in one of two stable states. In either state the current in one cryotron gate flows through the grid-control of the opposite cryotron to insure the latter's resistance.

In accordance with the present invention, a current increase through a cryotron gate has the effect of rendering the same gate resistive. In a particular embodiment a bias field is applied to a cryotron gate while the gate and grid-control of this cryotron are disposed in branches of a generally parallel circuit.

A preferred embodiment comprises a cross-coupled cryotron flip-flop or cross-latch including a pair of cryotrons. Two branch circuits of the flip-flop each serially include the gate of one crytron and the grid-control of the remaining cryotron to provide cross-coupling, and the two branches are connected in parallel across a common current source. Another source of current is coupled across the grid-control of a first cryotron in a direction to oppose or buck the current from the aforementioned common source. As current increases in the gate of the first cryotron in a first branch, current decreases in the second branch including the grid-control of the same cryotron, at least partly because the two branches are disposed across the same current source. But since this second branch not only includes the grid-control of the first cryotron, but also a bucking source conntcted across it, current in the grid-control of the first cryotron increases as the second branch current decreases; this action tends to render the first cryotron gate resistive rather than more super-conductive as in the conventional bistable circuit. Contrariwise, when the first cryotron's gate becomes resistive, its grid-control current will be found to be small allowing the gate to become superconducting again. In such manner, sustained oscillations are accomplished in a single stage superconducting circuit since neither state of the circuit is completely stable.

Figure 5:
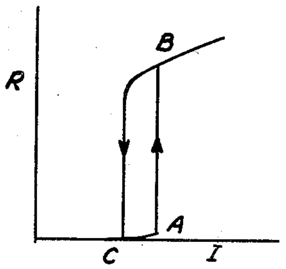
Figure 6:
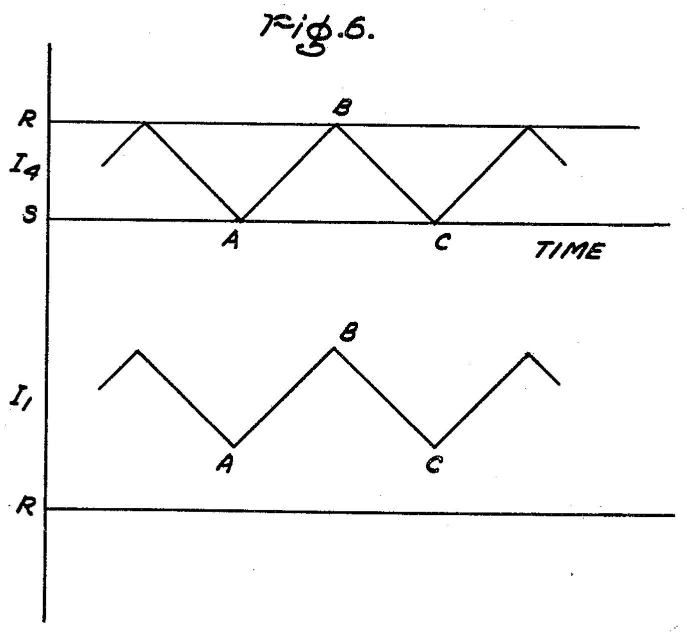

The subject matter which I regard as my invention is particularly pointed out and distinctly claimed in the concluding portion of this specification. The invention, however, both as to organization and method of operation, together with further objects and advantages thereof, may best be understood by reference to the following description taken in connection with the accompanying drawings wherein like reference characters refer to like elements and in which:

FIG. 1 is a schematic diagram of one embodiment according to the present invention, FIG. 2 is a simplified schematic representation of the FIG. 1 circuit, FIG. 3 is a modified higher frequency embodiment of the present invention employing compact planar components, FIG. 4 is a plot of the relation between magnetic field and temperature, designating the combination of such values as will allow various superconductors to remain superconducting, FIG. 5 is a plot of resistance in a superconductor vs. current, illustrating the hysteresis characteristics evidenced when a superconductor is successively rendered resistive, and FIG. 6 is a wave form diagram for the cryogenic oscillator in accordance with the present invention.

In FIG. 1 there is illustrated an embodiment of the present invention employing a pair of cryotrons, 1 and 2, employing superconductors in a free running oscillator circuit. The circuit is shown in a somewhat simplified form in FIG. 2 for ease of interpretation.

Cryotron 1 includes a gate 3 around which is disposed a magnetic means in the form of a grid-control coil 4, of a material exhibiting a higher critical temperature and critical field, as well as a higher critical current than the gate. Cryotron 2 is similarly constructed, including a gate 5 and a grid-control 6. Cryotron 2 is preferably identical to cryotron 1.

The critical-field, critical-temperature characteristics for the gate and grid of a cryotron may be observed from FIG. 4, wherein the area toward the origin from each curve represents a superconducting region for that material. The grid-control of each cryotron is wound as a coil and formed of a material, niobium for example, capable of exerting a strong enough magnetic field on its associated crytron gate material, e.g. tantalum for rendering the gate resistive. The grid does so without driving itself resistive as a selected current is passed therethrough.

The cryotrons are cross-coupled or cross-latched such that the grid-control 6 is connected in series with gate 3 forming a first branch, and grid-control 4 is connected in series with gate 5 forming a second branch. The cross-coupling interconnections may be formed of niobium. As a matter of fact, all conductors as thus far described are superconductors and are maintained at a superconductive temperature for the materials used, by means not shown. The two branches are disposed in parallel across a current source represented as a battery or direct current supply 7 in series with a variable resistance 8. The currents in the two branches bear a generally inverse relation to one another because of the cross-coupling, and because the two branches are connected to the common source. That is, $I=I_1+I_2$. Therefore $I_2=I-I_1$.

As will be appreciated by those skilled in the art, the circuit thus far described is capable of residing in either one of two stable states. Either a current I flows from supply 7 through branch 6–3 whereby grid-control 6 keeps gate 5 resistive, or the current will reside in branch 4–5 while branch 6–3 is maintained in a resistive condition. The current will flow entirely in the superconductive branch as opposed to the resistive one, and no internal causation is present for alternating the superconducting state between branches. The superconducting and resistive roles may be interchanged only with the aid of outside intervention.

In accordance with an embodiment of the present invention, an additional source of bias current, for example including a battery or supply 9 in series with the variable resistance 10, is disposed across grid-control 4. This bias source is a direct current source poled in a direction to oppose or buck the current from source 7 through the branch including grid-control 4—that is in opposition to the tendency of this branch current through grid-control 4 to change in inverse relation to the current through gate 3. The value of the bias current supplied is adjusted by adjusting variable resistance 10 so this current is greater than the average value of $I_2$. If the current from supply 9 is designated as $I_3$, and the resultant current through grid-control 4 is designated as $I_4$, then $I_4=I_3-I_2$.

The purpose of the bias source is to cause grid-control 4 to produce a field around gate 3 which varies in opposition to the field due to current $I_2$ whereby to instigate oscillation, as will hereinafter be more fully explained in connection with the device's operation. It is appreciated that other magnetic means for producing a magnetic field in response to current in an associated gate, and for producing a bucking magnetic field, may be substituted for the arrangement as shown. For example, a permanent magnet may be disposed in the proximity of cryotron 1, the effect of which is to establish a magnetic flux in opposition to the magnetic flux caused by the flow of direct current $I_2$ in a grid-control 4.

In the complete circuit a pair of leads 14 and 15, connected across the paralleled circuit branches, provide an output for the oscillator. A capacitor 16 may be interposed in lead 14. A supply of direct current 17 in series with a variable resistance 18 and a switch 19 is coupled across a starting coil 20 wound around gate 5. Momentary closure of switch 19 can be employed to initiate oscillation in the circuit. Another circuit comprising a direct current supply 21 in series with a resistance 22 and a normally open switch 23 is disposed across grid-control 6 in a direction to oppose the current from supply 7 and may be used for concluding oscillations in the circuit.

"Input" leads 11 and 12 are connected across grid-control 4 and a capacitor 13 may be included in series with lead 11. The latter connections are mainly utilized for the purpose of reading-in information to the oscillator when used as a memory device. Each cryotron including its associated coils and cross-latching conductors is maintained at approximately 4.2° K. by conventional cryostat apparatus (not shown). The direct current supplies and the associated resistors and switches as well as capacitors and extremities of the output and input leads are normally external to the cryostat, being non-superconducting.

Operation of the circuit illustrated in FIGURES 1 and 2 will be described with reference to FIGURES 5 and 6 showing respectively the resistance hysteresis loop for cryotron gate 3 of cryotron 1, and the oscillation characteristics for the device. Supply 7 in conjunction with variable resistance 8 is adjusted to provide a current I to the two circuit branches, preferably more than 1½ times and less than twice the current required by either grid-control for rendering its gate resistive. To initiate oscillation, switch 19 may be momentarily closed delivering a current pulsation to coil 20 causing gate 5 to become resisitive; the oscillator may be similarly started by alternative methods as hereinafter set forth.

As gate 5 becomes resistive, the current I from supply 7 will seek to flow through a non-resistive branch comprising grid-control 6 and gate 3 and therefore current $I_2$ will in general decrease in branch 4–5. However, since $I_4=I_3-I_2$, it is evident the resultant current in grid-control 4 will tend to increase rather than decrease, due to the bucking action of supply 9; thus the current in grid-control 4 varies inversely with the branch current. This gate 4 current produces a magnetic field *around* gate 3 which increases as the current *through* gate 3 increases. The field increases to the point of rendering gate 3 resistive.

The action described may be illustrated by the curve A–B in FIGURE 6 at the top of the figure wherein the theoretical current $I_4$ in grid-control 4 is plotted vs. time. It is postulated that the values of current through grid-control 4 which render gate 3 resistive and subsequently superconductive are separated by a finite value of current and the device appears to operate in this manner. The extremities of the curve, denoted by lines S and R, represent superconducting and resistive states for gate 3.

When the gate 3 becomes resistive, current decreases therein causing an attendant current increase in the branch including gate 5. This increase in gate 5 may be ascribed in part to the decrease in current through grid-control 6 and in part to the fact that current I from supply 7, deferred from the branch including gate 3, tends to redistribute itself through the branch including gate 5. Supply 7 and variable resistance 8 may be considered a constant current source since the resistance of 8 is normally much greater than the other resistances present. Expressed mathematically, $I=I_1+I_2$ wherein $I_2$ is the current through the gate 5 branch. Thus the currents $I_1$ and $I_2$ are seen to vary in inverse relation. The decrease in current through gate 3 is illustrated by curve B–C in FIG. 6. When point C is reached the gate 3 will have become superconducting and the cycle will repeat, in the manner of continuous oscillation.

The current oscillations in grid-control 6 are schematically illustrated at the bottom of FIG. 6. The points A, B and C occur at times corresponding to points A, B and C on the upper curve. It is seen the two curves are in phase. It is also found that grid-control 6 tends to maintain gate 5 in a generally resistive condition as indicated by the curve's lyng above the lower line R.

As illustrated in FIG. 6, the values of current through grid-control 4 which render gate 3 cyclically super-conductive and resistive appear to be different. The difference may be described by a hysteresis characteristic illustrated in FIG. 5. FIG. 5 plots the approximate resistance of gate 3 vs. the current in its associated grid-control 4. As current in the grid-control is increased, resistance occurs at a first value of grid current toward the right-hand, upward-proceeding curve. However, as the grid current decreases, resistance returns at a lower value of grid current. During oscillation, the cryotron 1 may be considered to oscillate by tracing around this characteristic. The letters A, B and C designate the approximate timing at which transitions take place and correspond to points A, B and C in FIGURE 6.

The oscillation period of the circuit is a function of the circuit inductance and the circuit resistance. As will be appreciated by those skilled in the art, the inductance of grid-control coils 4 and 6 may be rather large and therefore a lower inductance embodiment, subsequently to be described, may be preferred for higher frequency purposes.

The frequency of oscillation for the circuit of FIG. 1 can be adjusted by adjusting the variable resistance 8. The frequency may be alternatively adjusted by means of varying resistance 18 with switch 19 closed, and resistance 18 adjusted to limit the current through coil 20 to a value less than will halt oscillations in the circuit altogether. An appropriate frequency-adjusting field for coil 20 is on the order of 70 oersteds. A larger magnetic field, on the order of 1000 oersteds, is capable of concluding oscillations. The oscillator is preferably stopped by closing switch 23 to a source including supply 21 of approximately 3 volts or by discharging a 2000 microfarad capacitor (charged to 3 volts) across grid-control 6. The oscillator may also be stopped by applying a large pulse at terminals 11 and 12.

In a particular example, the oscillator according to the present invention was constructed employing gates 3 and 5 consisting of 0.01 inch tantalum wire, 1¼ inch long. Grid-controls 4 and 5 were insulated niobium wire, 0.004 inch in diameter, comprising 385 turns wound in six layers around the respective gates. The grid current which causes resistance to fully appear in each gate was found to be approximately 0.55 ampere.

The current I from supply 7 was accordingly adjusted to approximately 0.82 ampere (1½ times the source current) and the current $I_3$ from supply 9 was adjusted to approximately 0.74 ampere. The cryotron gate 5 is found normally to remain in a just resistive condition; thus its grid 6 current is found to average approximately 0.55 ampere. Since $I_2=I-I_1=0.82-.55$, then $I_2$ averages approximately 0.27 ampere. $I_4$, the current in grid-control 4, equals $I_3-I_2$ or approximately 0.47 ampere, and therefore averages slightly less than the ultimate current required for rendering gate 3 resistive.

It is understood various modifications in construction of the oscillator, and in the values of current applied, may easily be executed by one skilled in the art. For example, the circuit operates quite satisfactorily if the current from supply 7 is on the order of one ampere, or if this current is reduced to ¾ ampere.

The oscillator of the present invention may be operated as a storage cell or memory device wherein its oscillating state represents a particular binary value and the non-oscillating state represents the opposite binary value. Thus the state of oscillation can be taken as representing a binary zero and a state of non-oscillation can be taken as representing a binary one. The oscillator can be started as in the case of storage cell operation, or otherwise, by delivering a set pulse across leads 14 and 15, or by merely shorting out resistance 8. Both cryotrons may then become resistive, but when the current is removed, cryotron gate 3 becomes superconducting first due to the bucking bias, leaving gate 5 resistive, and starting oscillation. After oscillations start a binary zero can be "stored" in the oscillator by supplying *no* input pulse at terminals 11 and 12. A binary one is then read into the system by a pulse applied at terminals 11 and 12 of voltage sufficient for stopping oscillation. An absence of output voltage between terminals 14 and 15 then denotes a binary one stored, while presence of a voltage denotes a binary zero.

The embodiment of FIG. 3 is substantially identical in construction and operation to the embodiment already set forth in respect to like portions and like reference numerals. The FIG. 3 embodiment employs planar or crossed-film cryotrons 1*a* and 2*a* in place of coiled cryotrons 1 and 2 of FIG. 1. The construction of this type of cryotron is set forth and claimed in the copending application of Vernon L. Newhouse and John W. Bremer, Serial Number 758,474 filed September 2, 1958 and assigned to the assignee of the present invention. The superconducting portions of the FIG. 3 circuit are deposited in printed circuit fashion upon a flat substrate in a manner as described in the aforementioned application. The arrangement of FIG. 3 has a considerable advantage over that shown in FIG. 1 inasmuch as the large inductances of grid-control coils 4 and 6 are avoided. Therefore the FIG. 3 circuit is capable of higher frequency oscillation.

Preferably the cryotrons 1*a* and 2*a* each include a cryotron gate 24 formed of a superconducting material, for example, tin, which is crossed by a superconducting grid 25 formed of a superconducting material displaying a higher critical field, for example, lead. The relative critical fields for these materials may be observed from FIG. 4. The grid is insulated from the underlying gate in each case and is narrow with respect thereto and is therefore capable of producing a high intensity magnetic field in the vicinity of the gate for control of the resistance thereof.

From the foregoing it is evident the oscillator according to the present invention provides a simple and compact oscillation circuit wherein continuous oscillations are generated and without a large $I^2R$ loss in the system; that is the device does not derive its frequency from a thermal time constant encountered in alternately heating a superconductor above its critical temperature and cooling the superconductor below its critical temperature. Neither does the oscillator of the present invention employ an excessive number of components as would be required for multi-stage ring circuits.

While I have shown and described several embodiments of my invention, it will be apparent to those skilled in the art that many changes and modifications may be made without departing from my invention in its broader aspects; and I therefore intend the appended claims to cover all such changes and modifications as fall within the true spirit and scope of my invention.

What I claim as new and desire to secure by Letters Patent of the United States is:

1. A cryogenic oscillator comprising a source of substantially constant current, first and second superconductive circuit branches coupled in parallel across said source, a first cryotron having a gate included in said first branch and a control conductor included in said second branch, said control conductor being disposed in close relation to said gate for applying a magnetic field to said gate capable of rendering said gate resistive as current from said source flows in said control conductor, a second cryotron having a gate included in said second branch in series with said first mentioned control conductor and a control conductor included in said first branch in series with said first mentioned gate, the control conductor of said second cryotron being disposed in close relation to the gate of said second cryotron for applying a magnetic field to the gate of said second cryotron capable of rendering it resistive when current from said source flows in the control conductor of said second cryotron, and bias current supply means coupled across one of said control conductors providing current thereto in a direction opposite to current flowing therein from said source of substantially constant current.

2. A cryogenic oscillator comprising a source of substantially constant current, first and second superconductive circuit branches coupled in parallel across said source, a first cryotron having a first gate included in said first branch and a first control conductor included in said second branch, said first control conductor being disposed in close relation to said first gate for applying a magnetic field to said first gate capable of rendering it resistive as current from said source flows in said first control conductor, a second cryotron having a second gate included in said second branch in series with said first control conductor and having a second control conductor included in said first branch in series with said first gate, the said second control conductor being disposed in close relation to the said second gate for applying a magnetic field to the said second gate capable of rendering it resistive when current from said source flows in said second control conductor, and means associated with one of said control conductors and independent of said gates for opposing to an increasing degree the magnetic effect of the current supplied by said source as the current from said source in the said one of said control conductors decreases.

3. A cryogenic oscillator comprising a source of substantially constant current including a D.C. voltage source and resistance in series therewith, first and second superconductive circuit branches coupled in parallel across said source, a first cryotron having a gate included in said first branch and a control conductor included in said second branch, said control conductor being disposed in close relation to said gate for applying a magnetic field to said gate capable of rendering said gate resistive as current from said source flows in said control conductor, a second cryotron having a gate included in said second branch in series with said first mentioned control conductor and a control conductor included in said first branch in series with said first mentioned gate, the control conductor of said second cryotron being disposed in close relation to the gate of said second cryotron for applying a magnetic field to the gate of said second cryotron capable of rendering it resistive when current from said source flows in the control conductor of said second cryotron, and bias current supply means coupled across one of said control conductors providing current thereto in a direction opposite to current provided thereto from said source of substantially constant current, said bias current supply means comprising a source of D.C. voltage with resistance in series therewith.

4. A cryogenic oscillator comprising current supply terminals, first and second superconductive circuit branches coupled in parallel between said terminals, a first cryotron having a first gate included in said first branch and a first control conductor included in said second branch, said first control conductor being disposed in close relation to said first gate for applying a magnetic field to said first gate capable of rendering it resistive as current from said current supply terminals flows in said first control conductor, a second cryotron having a second gate included in said second branch in series with said first control conductor and having a second control conductor included in said first branch in series with said first gate, the said second control conductor being disposed in close relation to the said second gate capable of rendering it resistive when current from said current supply terminals flows in said second control conductor, and means associated with one of said control conductors and independent of said gates for opposing to an increasing degree the magnetic effect of the current supplied from said current supply terminals as the current from said current supply terminals in said one of said control conductors decreases.

5. The oscillator according to claim 4 wherein said cryotrons each comprise a gate in the form of a thin film of soft superconducting material, and a control conductor in the form of a thin film of hard superconducting material crossing said gate, insulated from said gate, and narrow with respect to said gate.

References Cited by the Examiner

UNITED STATES PATENTS

| | | | |
|---|---|---|---|
| 2,725,474 | 11/55 | Ericsson et al. | 331—107 |
| 2,832,897 | 4/58 | Buck | 307—88.5 |
| 3,023,324 | 2/62 | Mackay | 331—107 |
| 3,042,852 | 7/62 | Steele | 307—88.5 |

ROY LAKE, *Primary Examiner.*

JOHN KOMINSKI, *Examiner.*